(12) United States Patent
Wang et al.

(10) Patent No.: US 12,235,540 B2
(45) Date of Patent: Feb. 25, 2025

(54) BACKLIGHT MODULE AND DISPLAY DEVICE

(71) Applicant: HEFEI RAYSEES AI TECHNOLOGY CO., LTD., Hefei (CN)

(72) Inventors: Daoyong Wang, Heifei (CN); Zhentao Li, Hefei (CN); Danyong Li, Hefei (CN); Yang Wang, Hefei (CN)

( * ) Notice: Subject to any disclaimer, the term of this patent is extended or adjusted under 35 U.S.C. 154(b) by 0 days.

(21) Appl. No.: 17/922,640

(22) PCT Filed: Feb. 8, 2022

(86) PCT No.: PCT/CN2022/075483
§ 371 (c)(1),
(2) Date: Nov. 1, 2022

(87) PCT Pub. No.: WO2023/150909
PCT Pub. Date: Aug. 17, 2023

(65) Prior Publication Data
US 2024/0219770 A1 Jul. 4, 2024

(51) Int. Cl.
*G02F 1/13357* (2006.01)
*G02F 1/1335* (2006.01)

(52) U.S. Cl.
CPC .. *G02F 1/133603* (2013.01); *G02F 1/133504* (2013.01); *G02F 1/133614* (2021.01)

(58) Field of Classification Search
CPC ............... G02F 1/133603; G02F 1/133504
See application file for complete search history.

(56) References Cited

U.S. PATENT DOCUMENTS

| 10,613,386 | B2* | 4/2020 | Sasaki | G02F 1/133611 |
| 11,385,498 | B1* | 7/2022 | Zhang | G02F 1/133606 |
| 2005/0001537 | A1* | 1/2005 | West | G02F 1/133603 |
| | | | | 313/506 |
| 2014/0160768 | A1 | 6/2014 | Tang et al. | |
| 2018/0107068 | A1* | 4/2018 | Sasaki | G02F 1/133603 |
| 2019/0113806 | A1 | 4/2019 | Hiraka | |
| 2020/0072445 | A1* | 3/2020 | Su | F21V 3/00 |
| 2020/0159073 | A1 | 5/2020 | Kyoukane et al. | |

(Continued)

FOREIGN PATENT DOCUMENTS

| CN | 103148449 A | 6/2013 |
| CN | 104154494 A | 11/2014 |
| CN | 104251461 A | 12/2014 |

(Continued)

OTHER PUBLICATIONS

Englisht translation of CN-211627972-U, Zhang, published Oct. 2020 (Year: 2020).*

(Continued)

*Primary Examiner* — Evan P Dzierzynski
(74) *Attorney, Agent, or Firm* — Jigang Jin (57) ABSTRACT

A display device includes a display panel, a first light source, and second light source. The first and second light sources are respectively aligned with a first spot and second spot in a direction perpendicular to a substrate. The first light source irradiates the first spot and a third spot with luminance of a first value, respectively. The first light source irradiates a midpoint between the first and second spots with a luminance value that is half of the first value.

10 Claims, 9 Drawing Sheets

(56) References Cited

U.S. PATENT DOCUMENTS

2023/0036292 A1\* 2/2023 Kim .................. G02F 1/133613
2023/0142417 A1 5/2023 Allen et al.

FOREIGN PATENT DOCUMENTS

| CN | 108511585 | A | | 9/2018 |
|---|---|---|---|---|
| CN | 211627972 | U | \* | 10/2020 |
| JP | 2018073668 | A | | 5/2018 |
| KR | 20150067861 | A | \* | 6/2015 |
| TW | 201207292 | A1 | | 2/2012 |
| WO | WO2011074644 | A1 | | 6/2011 |

OTHER PUBLICATIONS

English translation of Kim KR-20150067861-A (Year: 2015).\*
English translation of office action issued by Chinese patent office re application No. 202280003166.1.
Office Action in pending application for U.S. Appl. No. 17/922,465.

\* cited by examiner

BACKLIGHT MODULE AND DISPLAY DEVICE

CROSS-REFERENCE TO RELATED APPLICATIONS

This application is the U.S. National Stage of International Application No. PCT/CN2022/075483, filed Feb. 8, 2022, the content of which is incorporated herein by reference in its entirety.

FIELD OF INVENTION

The present disclosure generally relates to a backlight module and a display device including the backlight module and, specifically, to a backlight module that uses lenses to improve luminance uniformity.

BACKGROUND OF THE INVENTION

Liquid crystal display (LCD) devices have been widely used throughout the industry and in people's daily life. A LCD device has a LCD panel and a backlight module. The LCD panel receives light from the module and displays an image by adjusting the light transmittance through pixels backlight made of liquid crystal elements. There are direct-type and edge-type backlight modules. For a direct-type backlight module, the light source is disposed facing the rear surface of the LCD panel, irradiating the LCD panel directly. For an edge-type backlight module, the light source is disposed on a side of the LCD panel. A light-guiding plate is disposed adjacent to the rear surface of the LCD panel and guides the light to irradiate the LCD panel. In descriptions below, direct-type backlight modules are described.

In a direct-type backlight module, an array of light emitting diode (LED) is often used as the light source. As regions immediately over the LEDs are brightly irradiated, while regions between the LEDs are dimly irradiated, uneven luminance becomes an issue, especially when LCD devices are getting thinner and thinner. As a consequence, more LEDs are needed to improve luminance uniformity, causing an increase of the manufacturing cost. The present disclosure has been made in view of the above-described problems.

SUMMARY OF THE INVENTION

The present disclosure discloses methods and apparatus for a backlight module and a display device that contains the backlight module. In one aspect, a display device includes a display panel, a substrate disposed proximate to the display panel, and a plurality of LED light sources disposed on the substrate following a grid pattern to form a plurality of rectangle-shaped lighting units, wherein each lighting unit comprises four LED light sources disposed at the lighting unit's four corners, respectively, has a length L along a first direction X and a width W along a second direction Y, and irradiates a corresponding rectangular area with the same length L and width W on an interface of the display device, wherein each LED light source comprises an LED and a corresponding lens disposed above the LED, the corresponding lens directing light rays emitted from the LED onto (1) a first corner of the corresponding rectangular area on the interface of the display device with a first luminance value E1, (2) a second corner of the corresponding rectangular area with luminance of zero or substantially close to zero, wherein a distance between the first corner and the second corner is L along the X direction, (3) a first location (x, 0) with a luminance value E (x, 0) that is determined based on a linear change of luminance value from the first luminance value E1 at a first spot to a luminance value substantially close to zero at a second spot, wherein the first location, the first spot, and the second spot are on a first border line between the first corner and the second corner, and x is a distance between the first location (x, 0) and the first corner along the X direction, (4) a third corner of the corresponding rectangular area with luminance of zero or substantially close to zero, wherein a distance between the first corner and the third corner is W along the Y direction, (5) a second location (0, y) with a luminance value E (0, y) that is determined based on a linear change of luminance value from the first luminance value E1 at a third spot to a luminance value substantially close to zero at a fourth spot, wherein the second location, the third spot, and the fourth spot are on a second border line between the first corner and the third corner, and y is a distance between the second location (0, y) and the first corner along the Y direction, and (6) a third location (x, y) of the corresponding rectangular area with a luminance value of E (x, y) that is a product of E (x, 0) and E (0, y).

In another aspect, a backlight module includes a substrate, a first light source disposed on the substrate, a second light source disposed on the substrate and adjacent to the first light source, a first lens, and a second lens. The first light source, the first lens, and a first spot are aligned along a direction approximately perpendicular to the substrate. The second light source, the second lens, and a second spot are aligned along the direction. Light emitted from the first light source passes through the first lens to irradiate the first spot and a third spot with luminance of a first value, and irradiate a middle spot with luminance of a value that is half of the first value or substantially close to half of the first value. The middle spot is between the first spot and the second spot.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the leftmost digit of a reference number identifies the drawing in which the reference number first appears.

DETAILED DESCRIPTION

Detailed description of the present invention is provided below along with figures and embodiments, which further clarifies the objectives, technical solutions, and advantages of the present invention. It is noted that schematic embodiments discussed herein are merely for illustrating the invention. The present disclosure is not limited to the embodiments disclosed.

Figure 1:
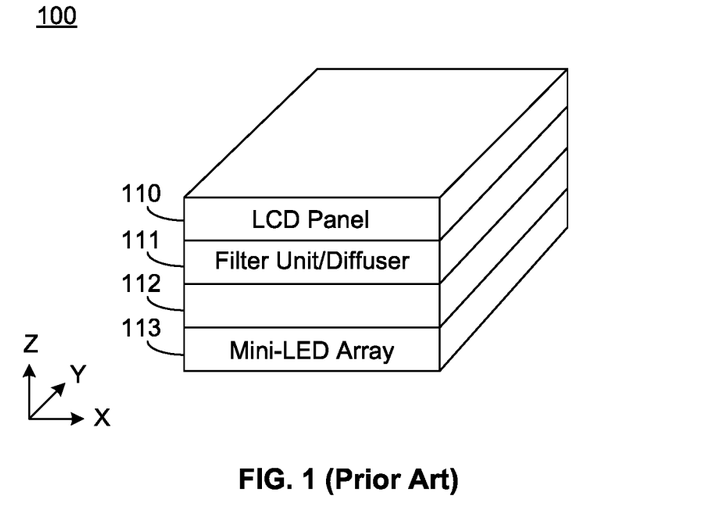
FIG. 1 is a perspective view of a prior art LCD device.

FIG. 1 shows a prior art display device 100 in a perspective view. The display device 100 has a LCD panel 110, a section 111 that contains a filter unit and a diffuser, a spacer layer 112, and a section 113 that contains a mini-LED array. The filter unit contains color filter elements that convert an incident light into light of different wavelengths, respectively. The diffuser may include a layer of a diffusion material, diffuse light passing through it, and improve luminance uniformity by reducing the luminance of bright portions of the light. The layer 112 may be made of an adhesive material such as resin that is transparent to the light.

During operation of the display device 100, light emitted from the mini-LED array in the section 113 spreads in and passes through the layer 112, before irradiating the section 111 or the diffuser. Because the layer 112 is arranged thin for a thin display device 100, the lower surface of the section 111 may have uneven luminance or uneven brightness. For example, regions immediately over the mini-LEDs may appear bright, while regions between the mini-LEDs may appear dim. In order to improve luminance uniformity, more mini-LEDs are added to the array, which increases the assembly and material cost. Further, even when more mini-LEDs are added to the mini-LED array, the diffuser is still needed for providing uniform luminance to the LCD panel.

Figure 2A:
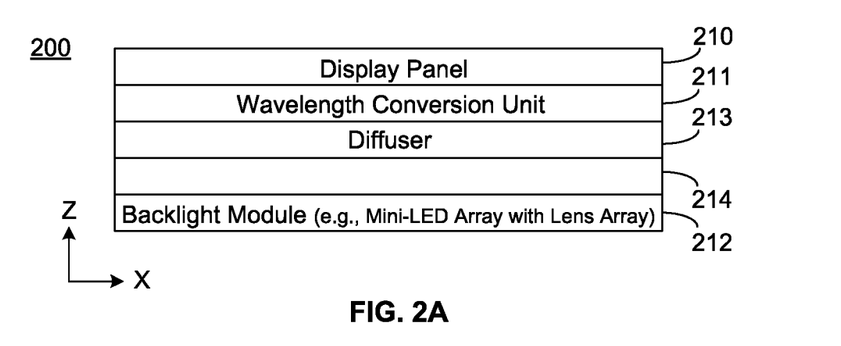
FIG. 2A schematically illustrates a cross-sectional view of a display device, according to embodiments of the present disclosure.

FIG. 2A schematically shows a cross-sectional view of a display device 200, according to embodiments of the present disclosure. The cross-sectional view is depicted in an X-Z plane. The display device 200 may include a display panel 210, a wavelength conversion unit 211, a backlight module 212, and a diffuser 213. The wavelength conversion unit 211 is adjacent to the display panel 210 and disposed between the display panel 210 and the diffuser 213. The backlight module 212 is disposed proximate to the display module 210 and separated from the display module 210 by the wavelength conversion unit 211, the diffuser 213, and a region 214. The region 214 may be configured between the diffuser 213 and backlight module 212. Optionally, the region 214 may be arranged inside the backlight module 212. In some other cases, the wavelength conversion unit 211, diffuser 213, and a part of the region 214 may be configured inside the display panel 210. As used herein, the terms "unit", "module", or "component" have the same meaning or similar meanings and can be used interchangeably.

The display panel 210 contains a matrix of pixels that form an image by controlling transmission of light through the pixels. Light, as used herein, may also be referred to as light rays. As the display panel 210 does not generate light itself, it needs a backlight such as the backlight module 212. The backlight module 212 emits light to illuminate the pixels of the display panel 210 to create an image. In some embodiments, the display panel 210 may be a LCD panel. In such cases, the display panel 210 may include a liquid crystal layer disposed between an upper substrate and a lower substrate, a first polarization layer, and a second polarization layer. The term "layer", as used herein, may also indicate a member. The liquid crystal layer is formed of liquid crystal molecules. Transparent electrodes are disposed on the upper and lower substrates. Each pixel of the LCD panel consists of a portion of liquid crystal molecules aligned between an upper and lower transparent electrode. By applying a voltage to a pixel through the electrodes, the arrangement of the liquid crystal molecules of the pixel is changed, and a certain amount of light passes through the pixel and makes the pixel appear a specific level of gray.

In some cases, the wavelength conversion unit 211 may contain a matrix of color filters deposited on a plate or substrate aligned to the pixels of the LCD panel. As each pixel may have three subpixels corresponding to red, green, and blue color, respectively, three color filters are arranged for a pixel. Color filters may consist of coloring materials such as pigments or dyes for which only light of a certain range of wavelength is transmissive.

In some other cases, the wavelength conversion unit 211 may contain a matrix of wavelength conversion elements deposited on a plate or substrate. The wavelength conversion elements may absorb light of a shorter wavelength (e.g., light of near ultraviolet), and then emit light of a longer wavelength (e.g., light of red, green, or blue color). Hence, a matrix of wavelength conversion elements may work in a similar way to a matrix of color filters described above.

The diffuser 213 may contain a diffusion layer made of a diffusion material, and is used to improve luminance uniformity. The display panel 210, wavelength conversion unit 211, and diffuser 213 may be fabricated separately and then bonded together at a later time. Optionally, the diffuser 213 and wavelength conversion unit 211 may be deposited on a plate or substrate sequentially, and the display panel 210 may be subsequently made using the wavelength conversion unit 211 as a base or substrate. Optionally, the display panel 210 may be made first, and the wavelength conversion unit 211 and diffuser 213 may be sequentially deposited on the bottom or lower surface of the display panel 210. In such cases, the diffuser 213 may become the bottom part of the display panel 210. Alternatively, the display panel 210 and wavelength conversion unit 211 may be integrated and made together. For example, a layer containing a matrix of color filters or a matrix of wavelength conversion elements may be configured between two layers of the display panel 210, such as between the liquid crystal layer and the first polarization layer (or the second polarization layer). Then, the wavelength conversion unit 211 may be fabricated between steps of depositing the liquid crystal and first polarization layers.

The backlight module 212 contains multiple light emitting elements disposed on a substrate. The light emitting elements form a matrix or array with a predetermined grid pattern to illuminate the display panel 210. The light emitting elements may be referred to as light sources, and include lasers, LEDs, micro-LEDs, mini-LEDs, and other small light emitting devices. An LED may also be referred to as an LED chip. A micro-LED chip may have a size smaller than 100 microns. A mini-LED chip may have a size of 100 to 200 microns or 100 to 300 microns. In descriptions below, as an example, a backlight (e.g., the backlight module 212) contains mini-LEDs. Alternatively, a light source may include a light emitting element and a lens that is configured for the light emitting element. That is, a light emitting element and a corresponding lens together may be referred to as a light source.

The region 214 may include a space between the backlight module 212 and the diffuser 213 or between the mini-LEDs and the diffuser 213. The diffuser 213 and the space (or the region 214) are configured between the wavelength conversion unit 212 (or the display panel 210) and the backlight module 212. When the wavelength conversion unit is a part of the display panel 210, the wavelength conversion unit 211 may be disposed above the mini-LEDs and between a member of the display panel 210 and the substrate of the mini-LEDs. The space in the region 214 may be vacuum or filled with air or an inert gas. In some cases, the space may also be filled with a transparent adhesive material (e.g., transparent resin). As mini-LEDs are small, they may be disposed closer to the diffuser 213 than regular LEDs, and make the region 214 thinner, which may make the display device 200 thinner.

When mini-LEDs are disposed proximate to the diffuser 213 and display panel 210, the mini-LEDs may irradiate the diffuser 213 with uneven luminance, causing uneven illumination on the display panel 210. While more mini-LEDs may be added to the backlight module 212 to reduce the uneven luminance as used in prior art systems or devices, manufacturing cost would increase. As explained below, the present invention achieves even luminance while not increasing the number of mini-LEDs.

Figure 2B:
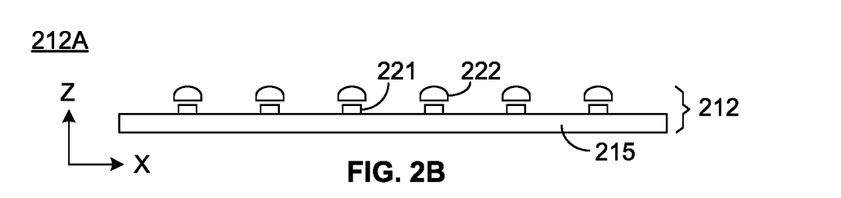
FIGS. 2B and 2C schematically illustrate a cross-sectional view and a top view of a backlight module of the display device shown in FIG. 2A, according to embodiments of the present disclosure.
Figure 2C:
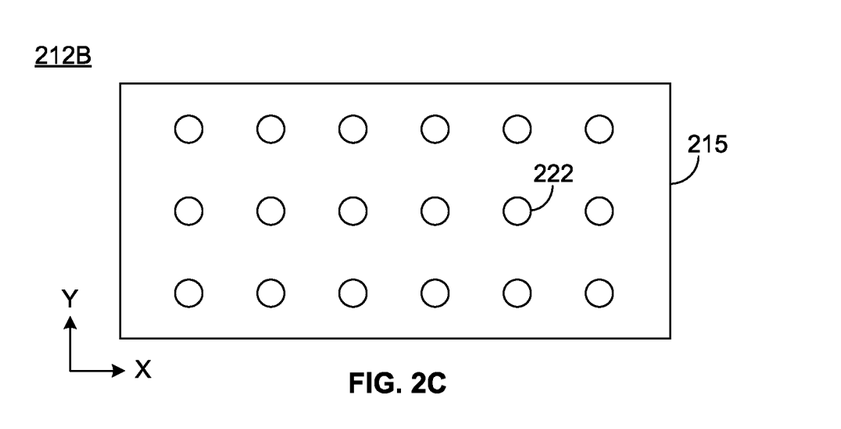

FIGS. 2B and 2C schematically illustrate a cross-sectional view 212A and a top view 212B of the backlight module 212 shown in FIG. 2A, according to embodiments of the present disclosure. The cross-sectional view 212A is in an X-Z plane, and the top view 212B is in an X-Y plane. As shown in FIGS. 2B-2C, the backlight module 212 contains mini-LEDs 221, lenses 222, and a substrate 215 on which the mini-LEDs 221 are disposed. The lenses 222 are positioned over the mini-LEDs 221, and aligned with the mini-LEDs 221 in the Z direction, respectively. Please note that the drawings or illustrations of the components/items in the figures (including the lenses) of this application are used for explanation purposes and they do not necessarily represent the actual shapes or dimensions of the components/items. In some embodiments, the mini-LEDs 221 form a matrix or array of light sources with a predetermined grid pattern, and the lenses 222 form a matrix or array of lenses (e.g., as shown in FIG. 2C) with the same grid pattern. The quantity, dimension, shape, and arrangement of mini-LEDs and lenses shown in FIGS. 2B and 2C and in other figures in the present disclosure are exemplary and for description purposes, although any suitable quantity, dimension, shape, and arrangement may be used for the disclosed backlight modules and display devices according to various embodiments of the present disclosure.

In the backlight module 212, each lens 222 is aligned with a mini-LED 221 along the Z direction or a direction proximately perpendicular to the substrate 215. In some cases, the lenses 222 may be fabricated individually, and then bonded with the mini-LEDs 221 respectively in an assembly process. In some other embodiments, an array of lenses 222 may be formed together by molding. For example, an optical unit or optical component may be molded that contains an array of the lenses 222 with a predetermined pattern. The optical unit may be held over the substrate 215 to make the lenses 222 align with the mini-LEDs 221, respectively. Further, the optical unit may be bonded with the substrate 215 after the alignment is performed.

The mini-LEDs 221 and lenses 222 are configured such that when light is emitted from the mini-LEDs, the lenses direct light rays or change the propagation direction of the light of each mini-LED differently at different angles. When the intensity of light generated from each mini-LED is changed differently at different angles by the lens 222, the light from the mini-LED array may merge and irradiate the diffuser 213 with relatively uniform luminance. In one aspect, fewer mini-LEDs 221 may be needed for the backlight module 212 and as a result, the manufacturing cost may be reduced. As the backlight module 212 may produce relatively uniform luminance, the diffuser 213 may have higher transmittance than those used in conventional display devices. The efficiency of the display device 200 may be increased. In addition, when the backlight module 212 provides luminance with uniformity beyond a certain level, the diffuser 213 may not be needed. That is, the display device 200 may not contain a diffuser (e.g., the diffuser 213) in some cases, which may lower the manufacturing cost further.

In descriptions below, lenses (e.g., lenses 222) are designed to create uniform luminance based on a light source array such as a mini-LED array. In some aspect, the mini-LED may be considered as a Lambertian light source that emits light in a Lambertian pattern. Optionally, the mini-LED may be an approximate Lambertian light source. The mini-LEDs are exemplarily used as a Lambertian light source in the following descriptions. As such, when there is no lens, the light from a mini-LED is dispersed according to Lambert's emission law. When a lens is incorporated with a mini-LED, the light emitted from the mini-LED is dispersed according to functions of the lens. The lens, as used herein, may indicate a lens system that contains one or more lenses. A lens may direct light differently at different angles. Since an array of lenses and array of mini-LEDs are used to create uniform luminance, the lens may be designed based on an array of Lambertian light sources and certain values of luminance uniformity on a surface or an interface. The term "interface", as used herein, indicates a boundary between two regions of space occupied by different materials. A surface may indicate an interface between the air (or vacuum or a gaseous environment) and a solid matter.

In certain embodiments, when a Lambertian light source irradiates an interface via a lens and values of luminance at each spot on the interface are known, the distribution of light intensity in angular coordinates may be calculated. Based on the distribution of light intensity in the angular coordinates and the radiation pattern of the Lambertian light source, data of the lens may be calculated using, for example, certain methods or lens design software. More details about designing a lens are illustrated below. The term "spot", as used herein, indicate a substantially small region or substantially small area that surrounds a point on an interface.

Figure 3A:
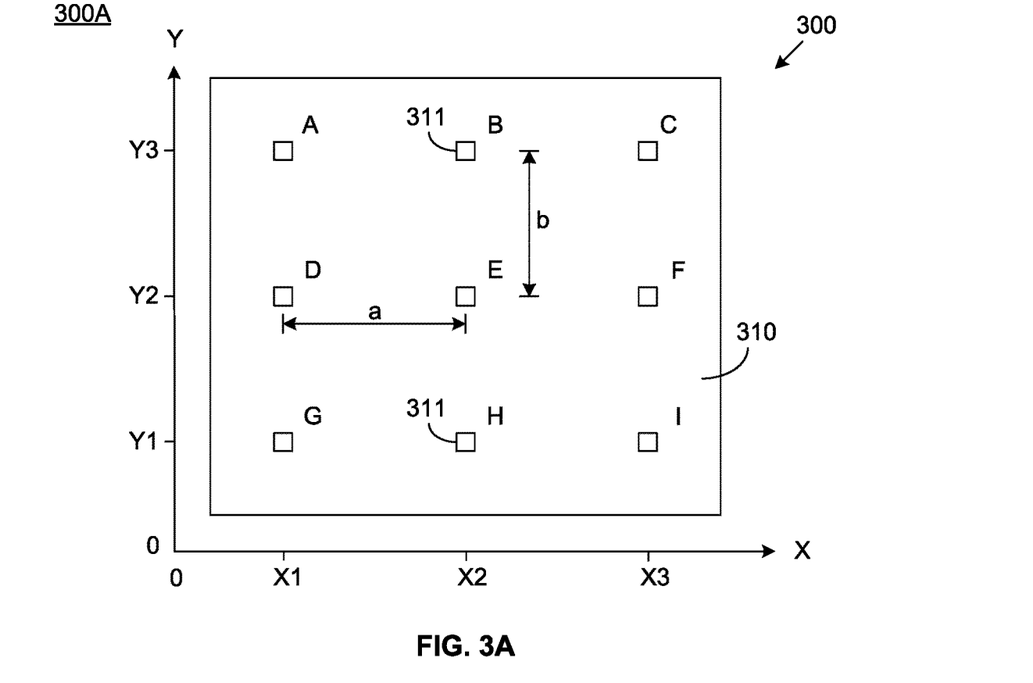
FIG. 3A schematically illustrates light sources of a backlight module in a top view, according to embodiments of the present disclosure.

FIG. 3A schematically shows a top view 300A of a backlight module 300 of a display device (not shown), according to embodiments of the present disclosure. The backlight module 300 contains an array of mini-LEDs 311 with a certain pattern disposed on a substrate 310, while corresponding lenses (or a corresponding array of lenses with the same pattern) are omitted in FIG. 3A. The array may exemplarily contain mini-LEDs A to I. The distance between centers of adjacent mini-LEDs 311 along the X direction has a value of a, and the distance between centers of adjacent mini-LEDs 311 along the Y direction has a value of b. In some cases, for example, the value of a and b may be in a range of 3 to 9 millimeters, respectively. Let X2−X1=a, X3−X2=a, Y2−Y1=b, and Y3−Y2=b. The values of a and b may be different in some cases. Optionally, the values of a and b may be the same in some other cases.

Figure 3B:
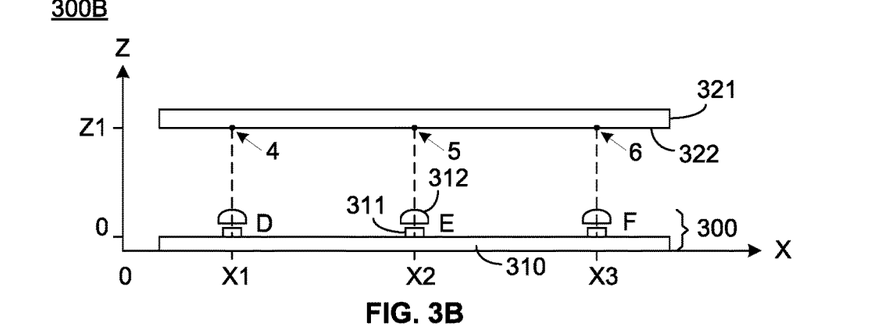
FIGS. 3B and 3C schematically illustrate cross-sectional views corresponding to the backlight module shown in FIG. 3A, according to embodiments of the present disclosure.
Figure 3C:
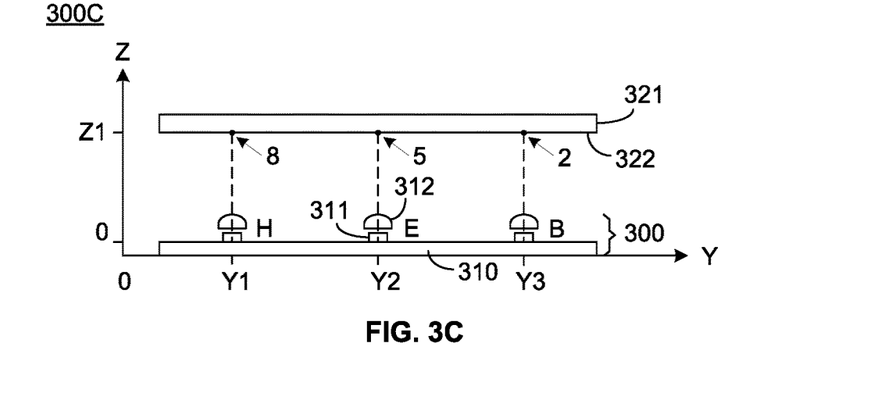

FIGS. 3B and 3C schematically illustrate cross-sectional views 300B and 300C of a structure containing the backlight module 300 shown in FIG. 3A, according to embodiments of the present disclosure. The structure may include the backlight module 300 and a diffuser 321 positioned over lenses 312, mini-LEDs 311, and the backlight module 300. The structure may be a part of the display device and disposed below a display panel (not shown) of the display device. The diffuser 321 has a lower surface or lower interface 322 that faces the lenses 312, the mini-LEDs 311, and the substrate 310. In some cases, provided that the space between the diffuser 321 and the backlight module 300 is filled with air. Then, the lower interface 322 is an interface between the air and a bottom layer or bottom part of the diffuser 321.

Figure 3D:
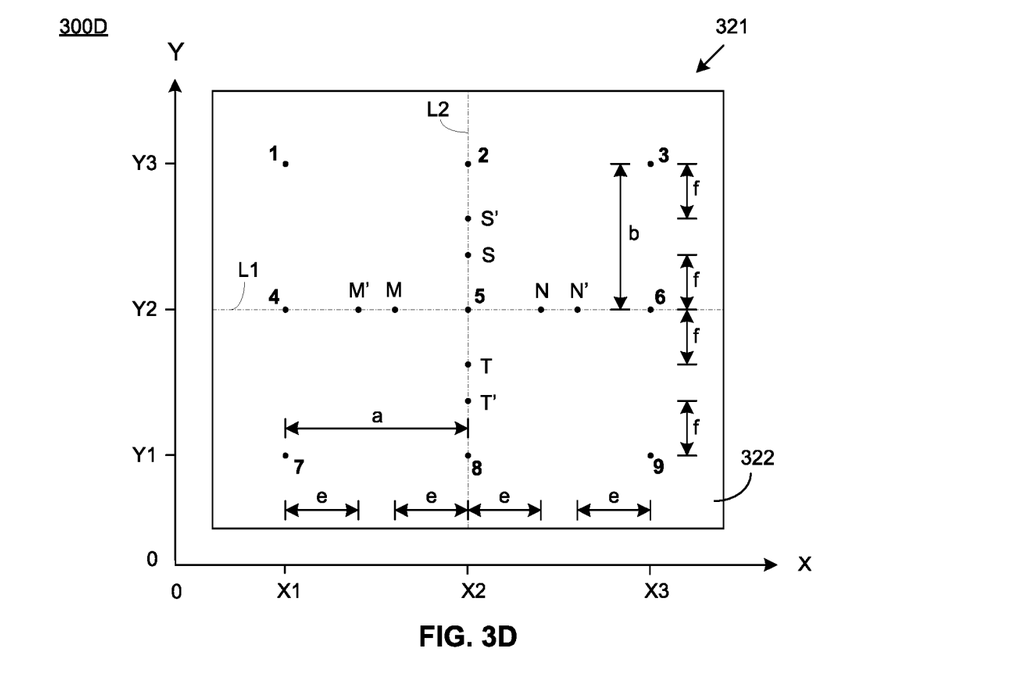
FIG. 3D schematically shows certain spots on an interface over of the light sources shown in FIG. 3A, according to embodiments of the present disclosure.

FIG. 3D is a diagram 300D that depicts spots 1 to 9 on the lower interface 322. The diagram 300D shows a view taken against the Z direction, i.e., a direction facing the backlight module 300. Spots 1-9 are immediately over the mini-LEDs A-I, respectively. For example, spot 5, the mini-LED E, and the lens of the mini-LED E are aligned along the Z direction or a direction approximately perpendicular to the substrate 310. As such, spots 1-9 form an array that has the same pattern as that of the array formed by the mini-LEDs 311. Hence, the centers of spots 1-9 are spaced apart by a in the X direction and by b in the Y direction.

As shown in FIGS. 3A-3D, the mini-LEDs 311 emit light toward to the diffuser 321 through the lenses 312. If there is no lens and the mini-LEDs irradiate the interface directly, spots 1-9 may be brightly irradiated, while it may be dimly irradiated in regions away from spots 1-9. Thus, the luminance on the lower interface 322 is not uniform. If regular concave lenses are used to further spread light from the mini-LEDs, spots 1-9 may become less brightly irradiated, but the interface may still have uneven luminance with bright areas and dim areas. Consequently, additional mini-LEDs and a diffuser are needed to make the luminance more uniform.

In the present disclosure, light emitted from a mini-LED 311 is processed by a lens 312. The configuration of the mini-LED array and the function of the lens 312 are arranged such that when all of the mini-LEDs 311 emit light during operation, the luminance uniformity in the area encircled by the mini-LEDs A-D and F-I is above a certain value. Thus, compared to conventional methods, fewer mini-LEDs may be employed.

Figure 3E:
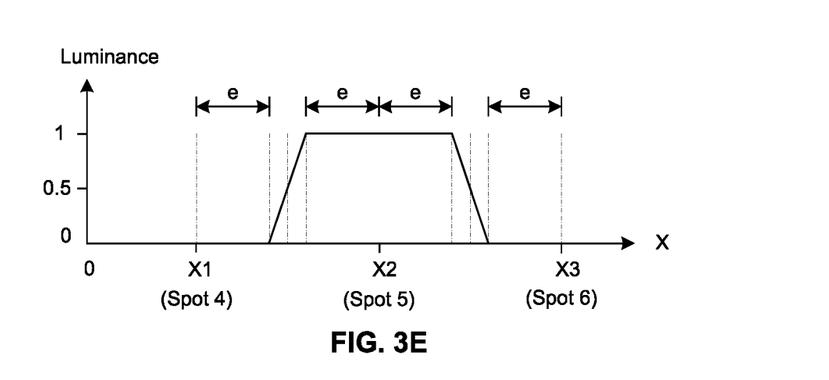
FIGS. 3E and 3F schematically show two curves reflecting changes of luminance.
Figure 3F:
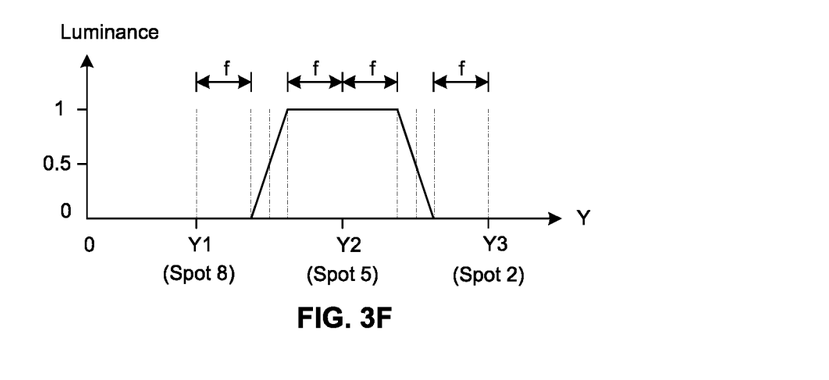

FIGS. 3E and 3F schematically show changes of luminance along the X direction and Y direction when a lens 312 is incorporated with the mini-LED E. In FIG. 3E, the curve reflects the change of luminance along a line L1 that passes through spots 4, 5, and 6 along the X direction with respect to FIG. 3D. Line 1 also passes spots M', M, N, and N'. The distances between spots 4 and M', 5 and M, 5 and N, and 6 and N' each have a value of e. The value of e is smaller than a/2. In some cases, e may be zero. When e equals zero, spots M', M and N, and N' merge with spots 4, 5, and 6, respectively. In this case, spots 4 and M', spots 5, M, and N, and spots 6 and N' are at the same location on the lower interface 322, respectively. In FIG. 3F, the curve reflects the change of luminance along a line L2 that passes through spots 8, 5, and 2 along the Y direction with respect to FIG. 3D. Line 2 also passes spots T', T, S, and S'. The distances between spots 2 and S', 5 and S, 5 and T, and 8 and T' each have a value of f. The value of f is smaller than b/2. In some cases, f may be zero. When f equals zero, spots S', S and T, and T' merge with spots 2, 5, and 8, respectively. In this case, spots 2 and S', spots 5, S, and T, and spots 8 and T' are at the same location on the lower interface 322, respectively.

As shown in FIGS. 3E-3F, when the mini-LED E is powered on, the luminance along line L1 is maximum (e.g., an arbitrary value 1) between spots M and N (including spots M and N), and minimum (e.g., zero, substantially close to zero, or below a predetermined darkness level) between spots 4 and M' and spots N' and 6 (including spots 4, 6, M', and N'). Optionally, the luminance along line L1 is substantially close to a maximum value between spots M and N (including spots M and N), and substantially close to a minimum value between spots 4 and M' and spots N' and 6 (including spots 4, 6, M', and N'). In the meantime, the luminance along line L2 is maximum (e.g., an arbitrary value 1) between spots T and S (including spots T and S), and minimum (e.g., zero, substantially close to zero, or below a predetermined darkness level) between spots 8 and T' and spots S' and 2 (including spots 2, 8, T', and S'). Optionally, the luminance along line L2 is substantially close to a maximum value between spots T and S (including spots T and S), and substantially close to a minimum value between spots 8 and T' and spots S' and 2 (including spots 2, 8, T', and S'). The luminance along line L1 changes linearly from the minimum value to the maximum value between spots M' and M, and spots N' and N. The luminance along line L2 also changes linearly from the minimum value to the maximum value between spots T' and T, and spots S' and S. The curve shown in FIG. 3E follows equations 1A to 1D.

$$E(x) = 0 \tag{1A}$$

$$E(x) = 1 \tag{1B}$$

$$E(x) = 1 - \frac{X2 - e - x}{a - 2e} \tag{1C}$$

$$E(x) = 1 - \frac{x - X2 - e}{a - 2e} \tag{1D}$$

Equation 1A applies when x is in ranges of X1 to X1+e and X3−e to X3, equation 1B applies when x is in a range of X2−e to X2+e, equation 1C applies when x is in a range of X1+e to X2−e, and equation 1D applies when x is in a range of X2+e to X3−e.

Similarly, the curve shown in FIG. 3F follows equations 2A to 2D.

$$E(y) = 0 \quad (2A)$$

$$E(y) = 1 \quad (2B)$$

$$E(y) = 1 - \frac{Y2 - f - y}{b - 2f} \quad (2C)$$

$$E(y) = 1 - \frac{y - Y2 - f}{b - 2f} \quad (2D)$$

Equation 2A applies when y is in ranges of Y1 to Y1+f and Y3−f to Y3, equation 2B applies when y is in a range of Y2−f to Y2+f, equation 2C applies when y is in a range of Y1+f to Y2−f, and equation 2D applies when y is in a range of Y2+f to Y3−f.

As equations 1C-1D and 2C-2D respectively describe the linear change and the minimum luminance is zero (or substantially close to zero), the luminance is half of the maximum value (or substantially close to half of the maximum value) at the midpoint between two corresponding spots (e.g., between spots 4 and 5, spots M' and M, spots 2 and 5, or spots S and S'). The midpoint indicates a spot that has an equal distance to two corresponding spots (e.g., spots M' and M).

Although equations 1A-1D and 2A-2D are arranged for spot 5 with regard to the mini-LED E, these equations may be adjusted to express the luminance on the lower interface 322 created by irradiation from other mini-LEDs, provided that the mini-LEDs A-I each have the same or substantially similar characteristics. For example, the mini-LEDs may generate values of maximum luminance on the lower interface 322 that are substantially close. For irradiation from the mini-LED D and a range of X1 to X2, for example, the luminance along line L1 follows equations 3A-3C.

$$E(x) = 0 \quad (3A)$$

$$E(x) = 1 \quad (3B)$$

$$E(x) = 1 - \frac{x - X1 - e}{a - 2e} \quad (3C)$$

Equation 3A applies when x is in a range of X2−e to X2, equation 3B applies when x is in a range of X1 to X1+e, and equation 3C applies when x is in a range of X1+e to X2−e.

Provided that both mini-LEDs D and E are powered on. When equations 1A and 3B, 1B and 3A, and 1C and 3C are respectively combined, the total luminance is always 1, a constant. That is, the luminance along line L1 from spot 4 to spot 5 (or X1 to X2) is always 1, a constant. In similar manners, when the mini-LEDs G and H are powered on, the luminance on a line connecting spots 7 and 8 is also always 1. When the mini-LEDs C and F are powered on, the luminance on a line connecting spots 3 and 6 is always 1, as well. The constant luminance applies to other lines connecting adjacent spots among spots 1-9 along the X or Y direction on the lower interface 322.

Figure 3G:
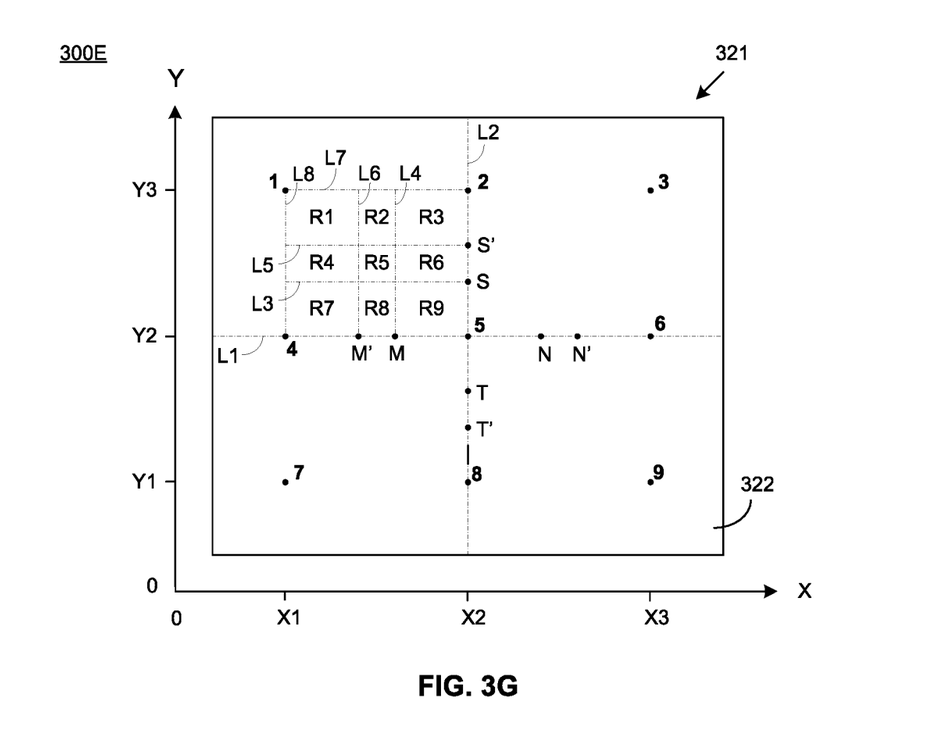
FIG. 3G schematically shows certain regions on the interface over of the light sources shown in FIG. 3A, according to embodiments of the present disclosure.

FIG. 3G is schematic diagram 300E that illustrates certain regions on the interface 322 according to embodiments of the present disclosure. As shown in FIG. 3G, lines L3, L5, and L7 are parallel to line L1 or the X axis, and lines L4, L6, and L8 are parallel to line L2 or the Y axis, respectively. Line L7 connects spots 1 and 2, while line 8 connects spots 1 and 4. Lines L3 and L5 pass through spots S and S', and lines L4 and L6 pass through spots M and M', respectively. Lines L1, L2, L7, and L8 form a rectangle (or square) with spots 1-2 and 4-5 located at the corners of the rectangle (or square).

The spots 1-2 and 4-5 correspond to the mini-LEDs A-B and D-E that may form a lighting unit in some embodiments. Lines L3-L6 divide the rectangle (or square) into 9 regions R1-R9.

Provided that the mini-LEDs A-B and D-E are powered on. Let the luminance at any spot be E(x)*E(y) for each of the mini-LED. In the region R9, the luminance is determined by the mini-LED E. At any spot in the region R9, E(x) and E(y) are determined by equations 1B and 2B, respectively. Thus, the luminance at any spot in the region R9 is always 1 according to equations 1B and 2B. The luminance in the region R8 is controlled by the mini-LEDs D and E. For the mini-LED E, equations 1C and 2B express the luminance at any spot in the region R8. For the mini-LED D, equation 2B and an adjusted equation 1D may be used to express the luminance at any spot in the region R8. The addition of luminance of the mini-LEDs D and E at any spot is always 1 in the region R8. Similarly, the luminance in the region R6 is controlled by the mini-LEDs B and E, and the addition of luminance of the mini-LEDs B and E at any spot is always 1 in the region R6.

The luminance in the region R5 is controlled by the mini-LEDs A-B and D-E. For the mini-LED E, let the luminance at any spot in the region R5 follow equation 4, which is based on equations 1C and 2D.

$$E1(x, y) = \left(1 - \frac{X2 - e - x}{a - 2e}\right) * \left(1 - \frac{y - Y2 - f}{b - 2f}\right) \quad (4)$$

Similarly, for the mini-LEDs A, B, and D, we have the following equations to express the luminance created at any spot in the region R5, respectively.

$$E2(x, y) = \left(1 - \frac{x - X1 - e}{a - 2e}\right) * \left(1 - \frac{Y3 - f - y}{b - 2f}\right) \quad (5)$$

$$E3(x, y) = \left(1 - \frac{X2 - e - x}{a - 2e}\right) * \left(1 - \frac{Y3 - f - y}{b - 2f}\right) \quad (6)$$

$$E4(x, y) = \left(1 - \frac{x - X1 - e}{a - 2e}\right) * \left(1 - \frac{y - Y2 - f}{b - 2f}\right) \quad (7)$$

When E1(x, y), E2(x, y), E3(x, y), and E4(x, y) are added up, the total value of luminance is 1. Thus, the luminance at any spot in the region R5 is 1 when the mini-LEDs A-B and D-E are turned on.

In similar manners, the luminance at any spot in the regions R1-R4 and R7 may be determined. The luminance at any spot in the regions R1-R4 and R7 is 1 when the mini-LEDs A-B and D-E are turned on. Thus, the luminance at any spot in the regions R1-R9 is 1 in such a case.

The method illustrated above may be used to express the expected luminance in the regions R1-R9 and other regions on the lower interface 322 for a mini-LED. For example, based on equations 1A-1D, 2A-2D, and 4, the expected luminance on the lower interface 322 generated by the mini-LED E may be calculated, when x is from X1 to X3 and y is from Y1 to Y3. Let the luminance on the lower interface 322 be zero for the mini-LED E when x or y is outside above range.

In some embodiments, the array of mini-LEDs 311, as shown in FIG. 3A, may be considered as an array of a predetermined grid pattern that contains rectangle-shaped lighting units. Each lighting unit includes four light sources disposed at the lighting unit's four corners. The light source contains a mini-LED 311. Optionally, the light source may contain a mini-LED 311 and a lens 312. There are multiple lighting units as shown in FIG. 3A. For example, one lighting unit may include the mini-LEDs A, B, D, and E at the four corners, and another lighting unit may include the mini-LEDs B, C, E, and F at the four corners. The lighting unit has a length a along the X direction, and width b along the Y direction.

The lighting unit irradiates a corresponding rectangular area with the same grid pattern (e.g., the same length a and width b) on the lower interface 322. As shown in FIG. 3D, for example, a corresponding rectangular area contains spots 1, 2, 4, and 5 at its four corners. When e equals zero in some cases, spots M' and M merge with spots 4 and 5, respectively. That is, spots M' and M become located at the corners, respectively. A line connecting two spots at the corners of a corresponding rectangular area along the X or Y direction may be referred to as a border line. Luminance in a corresponding rectangular area may be arranged using equations depicted above with some adjustment. When a lighting unit (i.e., four mini-LEDs) is powered on, it irradiates the corresponding rectangular area with luminance uniformity above a certain value. For example, luminance of a corresponding rectangular area including the four border lines may have the same luminance value or substantially similar luminance values. Additionally, when one mini-LED is turned on, it irradiates the corresponding rectangular area in the same manner as described above. For example, when the mini-LED E is on, it irradiates a border line connecting spots 2 and 5 with luminance that is illustrated in FIG. 3F. The luminance may remain at a minimum value, change linearly from the minimum value to a maximum value, and remain at the maximum value at different segments of the border line.

Figure 3H:
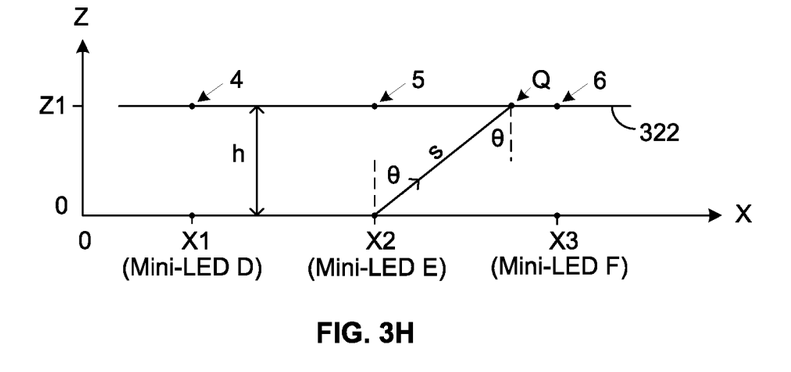
FIG. 3H schematically shows a diagram of a light path corresponding to the configuration shown in FIG. 3B.

FIG. 3H is a schematic diagram showing a light path for the mini-LED E corresponding to the configuration shown in FIG. 3B. Provided that the min-LED E emits light rays that propagate along the light path and impinge on a spot Q on the lower interface 322. The distance between the mini-LED E and the lower interface 322 is h. In some cases, for example, the value of h may be in a range of 3 to 6 millimeters. θ is the angle between the light path and the interface normal (i.e., against the Z direction). The distance between the mini-LED E and spot Q is s. Let E be the luminance and I the intensity of light (or light intensity) at spot Q. The luminance and light intensity follow equation 8.

$$E = (I/s^2) * \cos\theta \qquad (8)$$

Since values of luminance E on the lower interface 322 are known as illustrated above, the light intensity at various spots on the interface 322 may be calculated using equation 8.

Figure 3I:
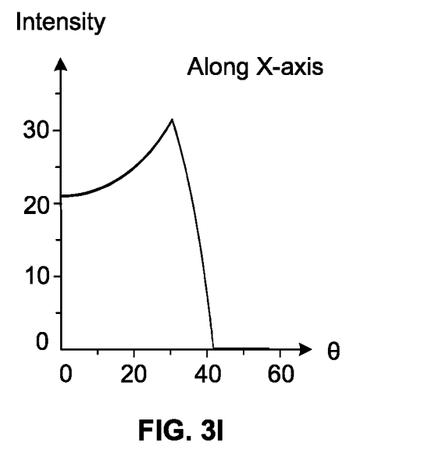
FIGS. 3I and 3J schematically show the intensity versus angle for light emitted from a light source of the backlight module with regard to FIGS. 3A-3D.
Figure 3J:
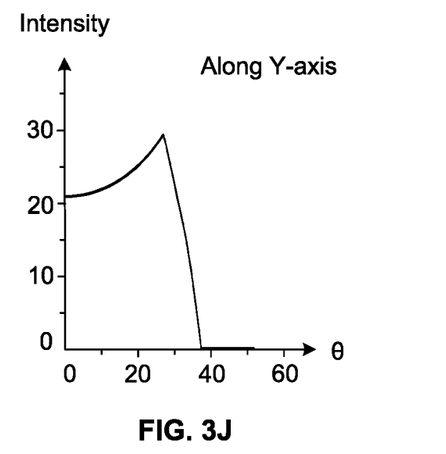

FIGS. 3I and 3J are schematic diagrams showing the intensity of light emitted from the mini-LED E with regard to FIGS. 3A-3D. Arbitrary units are used in these figures. Based on equation 8, the light intensity may be calculated for points from X2 to X3 along line L1. For each point on line L1, angle θ may also be calculated. The curve of intensity versus angle along line L1 is shown in FIG. 3I schematically. The curve of intensity versus angle from Y2 to Y3 along line L2 is shown in FIG. 3J schematically.

After values of light intensity are obtained via calculation, data of a target lens may be obtained by using, for example, certain software including certain lens design software. Data of a lens includes, for example, the shape and dimensions of the incident and exit surfaces, the distance between the incident and exit surfaces, the lens material, the refractive index of the lens material, etc.

Figure 4:
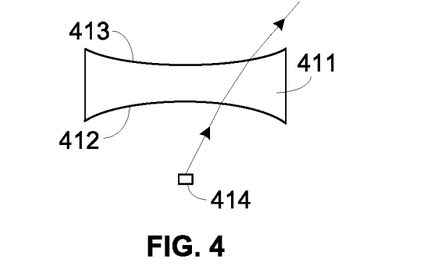
FIG. 4 shows a diagram of light passing through a concave lens.

FIG. 4 shows a diagram of light passing through an exemplary concave lens 410. The lens 410 has two surfaces 412 and 413 on opposite sides. The surface 412 faces a light source 414 and may be referred to as the light incident surface. The surface 413 faces away from the light source 414 and may be referred to as the light exit surface. Light rays impinge on the incident surface 412 and change the direction of propagation after passing through the incident surface 412 due to refraction. The light rays change the direction of propagation again after passing through the exit surface when exiting the lens 411 due to refraction.

Designing a lens involves determining the incident surface and the exit surface of the lens. In some cases, the incident surface may be determined first at the beginning of a lens design process to reduce the calculation load. The predetermined incident surface may include, for example, a flat surface or a curved surface (e.g., a convex surface, a concave surface, an aspheric surface, or a freeform surface). The term "free form surface", as used herein, indicates a surface that has no rotational symmetry or translation around the optical axis. As both the incident and exit surfaces are used to change the propagation direction of light rays, it may be arranged that one of them makes a bigger change of propagation direction than the other one. For example, in some cases, about 50-70% of the change of propagation direction may be made by the exit surface.

Figure 5:
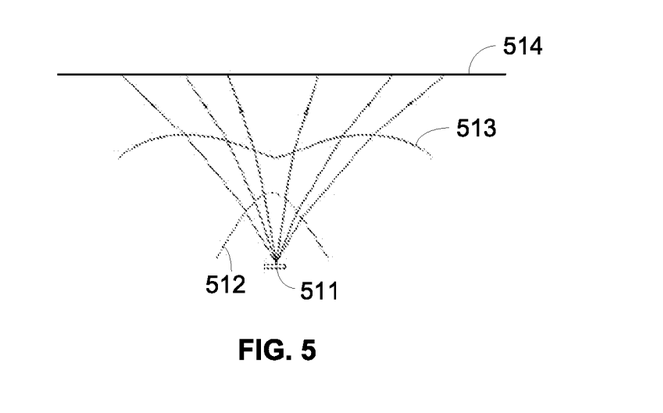
FIG. 5 shows a diagram of light irradiating a surface via a lens.

FIG. 5 is a diagram illustrating light rays irradiating a surface after passing through a lens, and used to describe a lens design process schematically. Assuming that a light source 511 is disposed at a location under a lens. The lens has an incident surface 512 and exit surface 513. The light source 511 generates light rays that pass through the lens and then illuminate a flat surface 514 (e.g., the bottom surface of a diffuser). Assuming that the surface 514 receives all light emitted from the light source 511. Based on energy conservation, equation 9 is obtained.

$$\int\int I(u,v)dudv = \int\int E(x,y)dxdy \qquad (9)$$

I(u,v) represents the light intensity emitted by the light source 511 in an angular coordinate system (u,v). E(x,y) represents the luminance received on the surface 514 in a Cartesian coordinate system (or orthogonal coordinate system) (x,y). From equation 9, equations 10 and 11 are obtained.

$$\int\int I_0 \cos u * \cos^2 v \, dudv = \int\int E(x,y)dxdy \qquad (10)$$

$$I_0 \cos u * \cos^2 v \, dudv = E(x,y)dxdy \qquad (11)$$

$I_0$ is a fixed value determined by prearranged conditions. Equation 11 illustrates energy conservation in a differential form, i.e., the luminance received in a small area at (x,y) on the surface 514 corresponds to the light intensity of a small portion of light rays at (u,v).

When light passes through the incident surface 512 and exit surface 513 sequentially, it is refracted twice. The refracted angle follows Snell's law of refraction. As such, the optical path of each light ray, from the light source 511 to the surface 514 via the lens, may be calculated using Snell's law.

When the radiation pattern (e.g., light intensity at different angles) of the light source 511 and desired values of luminance on the surface 514 are known, the shape of the incident and exit surfaces 512 and 513 and other data of the lens may be obtained by calculation. As illustrated above, the desired values of luminance on the surface 514 may be obtained using equations 1A-1D, 2A-2D, and 4 with some adjustment. The desired values of luminance may also be referred to as the expected values of luminance. In some cases, the incident surface 512 may be predetermined and thus has a known surface with fixed data. The exit surface 513 is a free form surface and may have certain predetermined initial data. For example, the exit surface 513 may have an initial shape that will be adjusted or modified multiple times during the lens design process.

As radiation patterns of the light source 511 and data of the incident surface 512 are known, after light rays pass through the incident surface 512, a calculation process may be performed to determine optical paths or trajectories of the light rays inside the lens as a result of diffraction. The light rays may be divided into small portions and the trajectory of each small portion inside the lens is calculated. The exit surface 513 may be divided into small regions. Each small portion of the light rays may impinge onto one or more small regions of the exit surface 513. The surface 514 may be divided into small areas. As the trajectory of each small portion of the light rays may be calculated after the light rays exit the lens, and each trajectory leads to one or more of the small areas of the surface 514, the location of a corresponding small area or small areas of the surface 514 may be obtained. Subsequently, luminance in the corresponding small area or small areas may be calculated using equation 11 when the light rays impinge onto the surface 514.

The calculated values of luminance on the surface 514 are compared with the expected values of luminance, and the difference between them is used to adjust the data of the exit surface 513. For example, if the luminance value is too big in a small area of the surface 514, one or more corresponding small regions of the exit surface 513 may be identified. Thereafter, the one or more corresponding small regions of the exit surface 513 may be adjusted to steer some part of the one or more corresponding small portions of light rays away from the one or more corresponding small areas of the surface 514. The method may be performed to adjust every small regions of the exit surface 513, and above steps may repeat multiple times until the difference between the calculated values of luminance and expected values of luminance on the surface 514 is below a certain level. Then, the finalized small regions of the exit surface 513 are stitched together to form the exit surface 513.

Figure 6:
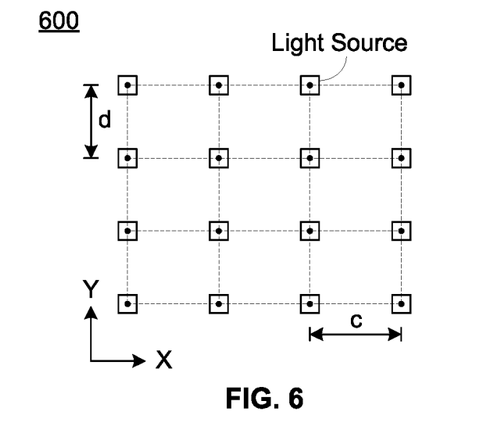
FIGS. 6 and 7 schematically illustrate light sources arranged in different configurations, according to embodiments of the present disclosure.

FIGS. 6 and 7 schematically show configurations 600 and 700 of the light sources, according to embodiments of the present disclosure. As described above, light sources (e.g., mini-LEDs) may be arranged on a substrate based on the lighting units. The lighting units may have a rectangular or square shape. In descriptions below, a rectangular shape is used exemplarily. Referring to the configuration 600 of FIG. 6, in some embodiments, the lighting unit, depicted in dashed lines, may include four light sources disposed at the lighting unit's four corners. The lighting unit may have a length c along the X direction, and width d along the Y direction. Optionally, a rectangular area (not shown) may be arranged on an interface and aligned with the lighting unit along a direction perpendicular to the substrate of the light sources. The rectangular area may have the same dimensions as that of the lighting unit (e.g., the same length c and width d) on the interface, and the lighting unit is configured to irradiate a corresponding rectangular area with even luminance. In this case, the total area of the rectangular areas equals the total area of the lighting units of the configuration 600.

Figure 7:
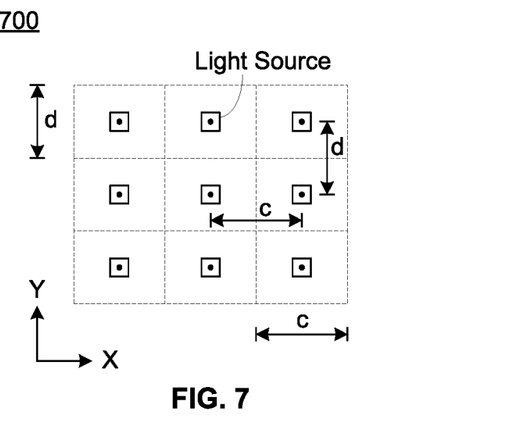

Referring to the configuration 700 of FIG. 7, in some other embodiments, the lighting unit of configuration 600, depicted in dashed lines, may each have a light source disposed at the center. As such, the configuration 700 has four lighting units as compared to nine in configuration 600, therefore significantly reducing the number light sources needed to illuminate a panel (in exchange for sacrificing a small area along the edge of the panel). It should be noted that the configurations of 600 and 700 are for illustration purposes only. In actual devices, the number of lighting units and the number of light sources (e.g., LEDs) are significantly higher.

Figure 8:
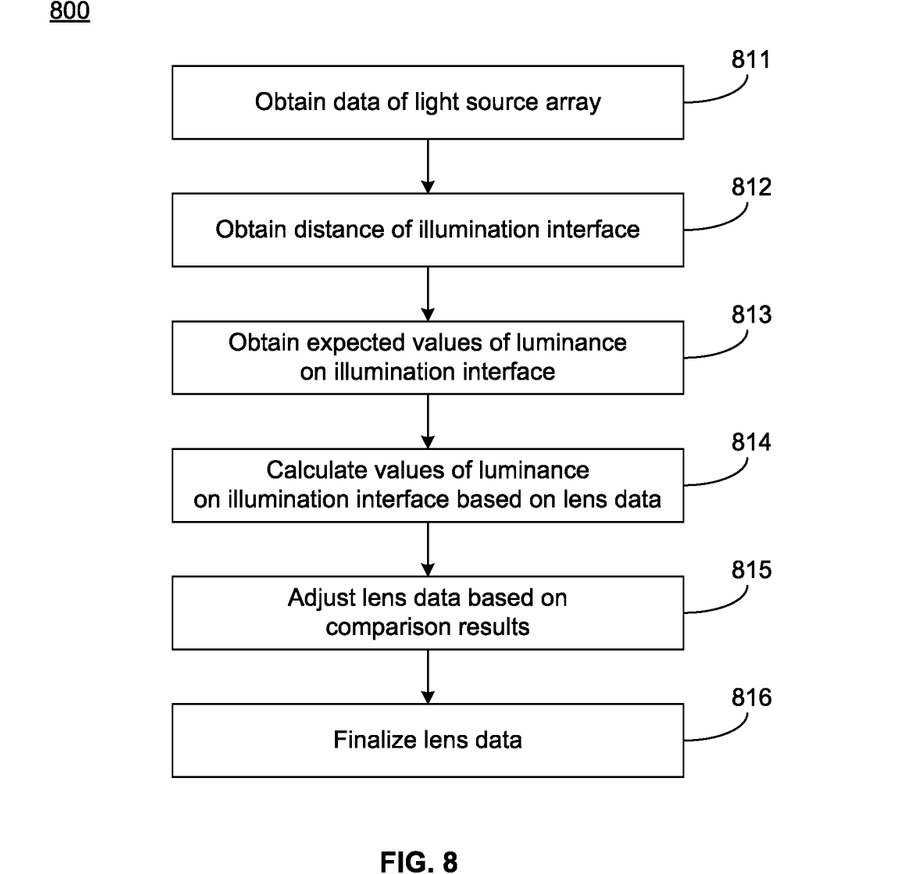
FIG. 8 illustrates a flow chart for designing a lens for a backlight module, according to embodiments of the present disclosure.

FIG. 8 shows a flow chart 800 for designing a lens for a backlight module, according to embodiments of the present disclosure. At step 811, data of a light source array is obtained. The data of the array may include pitches of the array along the X and Y directions that determine the distance between adjacent light sources along the X and Y directions. The light sources are disposed at the grid points of the array.

At step 812, a distance between a substrate and an illumination interface is obtained. The distance and data of the light source array are initial conditions for designing the lens. The light sources are disposed on a substrate, and the illumination interface may be a bottom surface of a diffuser that is away from the substrate with a predetermined distance. In some cases when the diffuser is inside or integrated with a display panel, the illumination interface may be disposed inside the display panel. That is, the illumination interface may be configured between the substrate and a layer (or member) of the display panel.

At step 813, values of luminance on the illumination interface, as part of the initial conditions, are obtained by calculation and used as the expected values of luminance. The distance between adjacent light sources along the X and Y directions, and the distance between the substrate and illumination interface are used in the calculation. In some cases, equations such as equations 1A-1D, 2A-2D, and 4 may be used to acquire the expected values of luminance.

At step 814, values of luminance on the illumination interface are calculated based on the above-described method. For example, equation 11, Snell's law, predetermined data of the lens including data of the incident surface, and temporary data of the exit surface of the lens may be used in the calculation.

At step 815, the calculated values of luminance on the illumination interface are compared with the expected values of luminance. The exit surface may be divided into small regions. Based on the comparison results, each small region of the exit surface is adjusted individually. Thereafter, steps 814 and 815 may be repeated to calculate values of luminance on the illumination interface based on the adjusted data of the exit surface, and compare the calculated values of luminance with the expected values of luminance. When the difference between the calculated values of luminance with the expected values of luminance is below a certain level, data of the exit surface or data of the lens is finalized at step 816.

Data of the lens may include data of the incident and exit surfaces, lens dimensions, refractive index of the lens material, and other characteristics. Without the lens, the light source emits light according to its original radiation pattern. For example, a mini-LED may emit light in a nearly Lambertian pattern. When the lens is coupled to the light source, the lens directs the light from the light source to irradiate the illumination interface. Light intensity is changed from an original radiation pattern to a modified pattern. Besides methods illustrated above, certain lens design software, which has been available in the field for some time, may be used to design the lens with the initial conditions. In some cases, the original radiation pattern of a light source may be measured and analyzed first. In some cases, as illustrated above, the incident surface of a lens may be predetermined as an initial condition to simplify the calculation process. Alternatively, both the incident and exit surfaces of a lens may be calculated, adjusted, and finalized at the same time.

Steps 811-816 describe methods to design a lens that may be used to improve luminance uniformity for a display device. The display device may contain a mini-LED array, a lens array, and a display panel. The mini-LED array and lens array are incorporated to illuminate the display panel with uniform luminance. Further, the mini-LED array and lens array may be scaled with the same grid pattern. For example, more mini-LEDs 311 and lenses 312 may be added to the arrays shown in FIGS. 3A-3C to expand the arrays. As such, the mini-LED array and lens array may be used for display devices of small sizes and large sizes conveniently. In addition, the mini-LED array and lens array may also be used for other devices or in other applications that need uniform luminance.

After the lens design process, data of the lens is recorded and transferred to a manufacturing facility. A number of the lenses may be made for constructing a lens array. Optionally, the lenses may be fabricated in the form of lens array. That is, a lens array arranged for a backlight module or display device may be prefabricated by, for example, a molding method before an assembly process.

Figure 9:
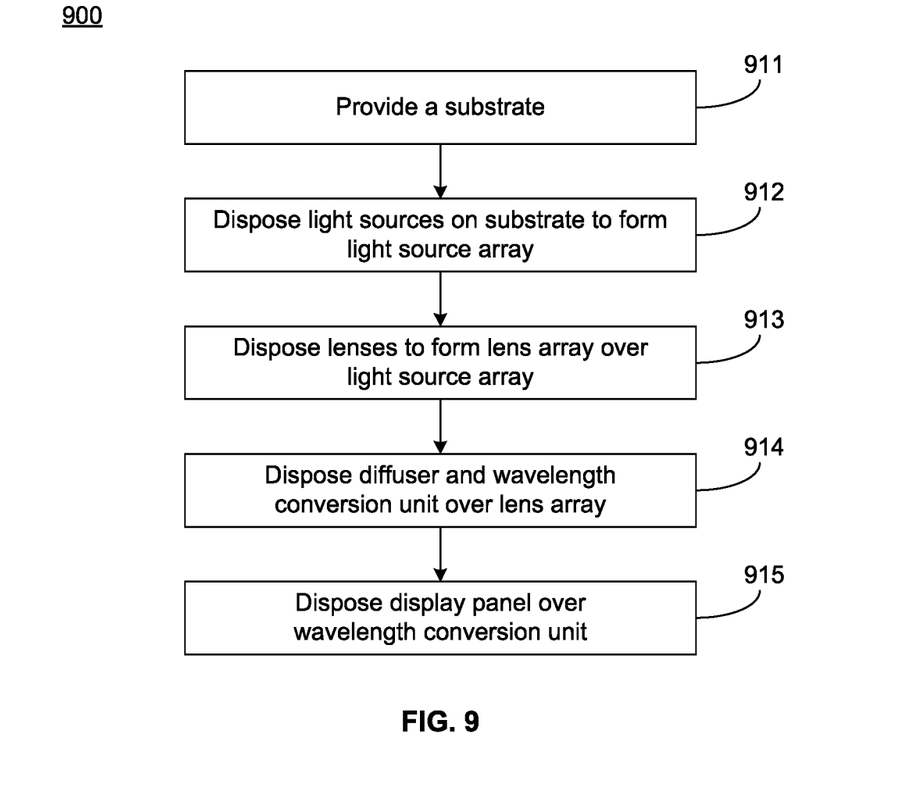
FIG. 9 illustrates a flow chart for assembling a backlight module and a display device, according to embodiments of the present disclosure.

FIG. 9 shows a flow chart 900 for fabricating a backlight module and a display device, according to embodiments of the present disclosure. A substrate is provided at step 911 for assembling a backlight module. The substrate may be a semiconductor substrate including a semiconductor material, or an insulating substrate including an electrically non-conductive material such as glass, a plastic material, or a ceramic material. Optionally, the substrate may also be a printed circuit board (PCB).

At step 912, light sources (e.g., mini-LEDs) are mounted on the substrate to form a light source array with a predetermined pattern (e.g., with predetermined pitch values along the X and Y directions). In some embodiments, the light sources are bonded on the substrate with an adhesive material after an alignment step is performed.

At step 913, lenses designed for the backlight module are provided. Each lens is disposed over and aligned with a light source on the substrate, and then fixed by, for example, a bonding method using an adhesive material and optionally, a lens fixture. In some embodiments, a lens array is prefabricated. The lens array may be placed over and aligned with the light source array in a direction approximately perpendicular to the substrate, and then get bonded using an adhesive material and optionally, a lens array fixture. In some embodiments, a housing unit may be provided for the backlight module. The housing unit may accommodate the substrate, light source array, and lens array. Optionally, the substrate may be disposed in the housing unit before the light sources are mounted.

At step 914, a diffuser and a wavelength conversion unit are disposed over the lens array or the backlight module sequentially. The diffuser may be placed at a predetermined distance from the light source array or the substrate, aligned to the lens array or the light source array in a direction approximately perpendicular to the substrate, and then bonded using an adhesive material. In some cases, the diffuser may be bonded with the housing unit. Further, the wavelength conversion unit may be placed above the diffuser, aligned to the lens array or the light source array in a direction approximately perpendicular to the substrate, and then bonded using an adhesive material. In some cases, the wavelength conversion unit may be bonded with the housing unit.

At step 915, a display panel is disposed over the wavelength conversion unit, aligned with the wavelength conversion unit in a direction approximately perpendicular to the substrate, and bonded with it. Optionally, the display panel may also be aligned with the substrate during the assembly process. For example, certain marks may be made on the substrate for alignment purpose. In some cases, the display panel may be bonded with the housing unit. In some embodiments, the housing unit may be designed to accommodate and protect all components of the display device including the backlight module and display panel.

Steps 911-913 describe methods and processes to fabricate a backlight module. In some cases, backlight modules may be made separately at a facility, and then sent to another facility for assembly of display devices. Alternatively, a display device may be fabricated through consecutive steps starting from mounting light sources on a substrate (e.g., steps 911-912). The steps further include disposing a lens array over the light source array, a diffuser over the lens array, a wavelength conversion unit over the diffuser, and a display panel over the wavelength conversion unit.

Optionally, a display panel may contain a diffuser and a wavelength conversion unit. In such cases, the steps of disposing a diffuser and a wavelength conversion unit over a backlight module as described above may be omitted. The backlight module and display panel may be aligned and bonded to form a display device directly.

In some other embodiments, a display device may not contain a diffuser. Consequently, above-described methods may omit the step of mounting a diffuser (e.g., aligning and bonding a diffuser). A wavelength conversion unit may be configured over a lens array directly. That is, a wavelength conversion unit may be positioned over and aligned with a lens array directly in an assembly process of display devices.

Figure 10:
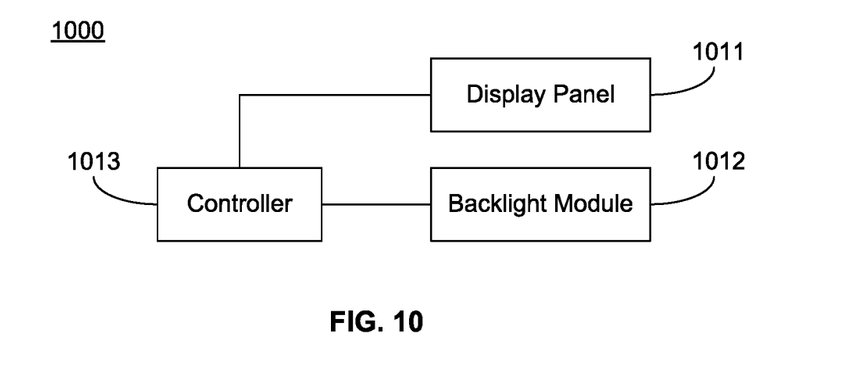
FIG. 10 illustrates a structural diagram of a display device, according to embodiments of the present disclosure.

FIG. 10 is an exemplary structural diagram 1000 of a display device. The display device may include a display panel 1011, a wavelength conversion unit (not shown), a backlight module 1012, and a controller 1013. The display panel 1011 may be a LCD panel. The backlight module 1012 may include a mini-LED array and provide uniform luminance for the wavelength conversion unit via a lens array. The controller 1013 may include a first control circuit that sends control signals to a gate driving circuit (not shown) and a data driving circuit (not shown). The gate driving circuit and data driving circuit are arranged to drive the display panel 1011 during operation of the display device. For example, the gate driving circuit may output scan signals, and the data driving circuit may output data voltage. The controller 1013 may further include a second control circuit that controls the backlight module 1012. The controller 1013 may be mounted on a PCB that is attached to a housing unit of the display device. The display device may also contain a power supply circuit (not shown) that supplies and controls various voltages or currents to the display panel 1011, the first and second control circuits, the gate driving circuit, the data driving circuit, and the backlight module (i.e., the mini-LEDs).

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

We claim:

1. A backlight module for a display device, comprising:
a substrate and a plurality of LED light sources disposed on the substrate following a grid pattern to form a plurality of rectangle-shaped lighting units,
wherein each lighting unit comprises four LED light sources disposed at the lighting unit's four corners, respectively, has a length L along a first direction X and a width W along a second direction Y, and irradiates a corresponding rectangular area with the same length L and width W on an interface of the display device, wherein any two adjacent ones of the plurality of rectangle-shaped lighting units share at least one of the plurality of LED light sources,
wherein each LED light source comprises an LED and a corresponding lens disposed above the LED, the corresponding lens directing light rays emitted from the LED onto
(1) a first corner of the corresponding rectangular area on the interface of the display device with a first luminance value E1,
(2) a second corner of the corresponding rectangular area with luminance of zero or substantially close to zero, wherein a distance between the first corner and the second corner is L along the first direction X,
(3) a first location (x, 0) with a luminance value E (x, 0) that is determined based on a linear change of luminance value from the first luminance value E1 at a first spot to a luminance value substantially close to zero at a second spot, wherein the first location, the first spot, and the second spot are on a first border line between the first corner and the second corner, and x is a distance between the first location (x, 0) and the first corner along the first direction X,
(4) a third corner of the corresponding rectangular area with luminance of zero or substantially close to zero, wherein a distance between the first corner and the third corner is W along the second direction Y,
(5) a second location (0, y) with a luminance value E (0, y) that is determined based on a linear change of luminance value from the first luminance value E1 at a third spot to a luminance value substantially close to zero at a fourth spot, wherein the second location, the third spot, and the fourth spot are on a second border line between the first corner and the third corner, and y is a distance between the second location (0, y) and the first corner along the second direction Y, and
(6) a third location (x, y) of the corresponding rectangular area with a luminance value of E (x, y) that is a product of E (x, 0) and E (0, y).

2. The backlight module of claim 1, wherein the corresponding lens directs the light rays onto the first spot and the third spot with luminance substantially close to the first luminance value E1, and the second and fourth spots with luminance substantially close to zero, respectively.

3. The backlight module of claim 1, wherein a distance larger than zero between the first corner and the first spot equals a distance between the second corner and the second spot.

4. The backlight module of claim 1, wherein luminance uniformity in the corresponding rectangular area on the interface of the display device is beyond a predetermined value when the four LED light sources at the lighting unit's four corners irradiate the corresponding rectangular area.

5. The backlight module of claim 1, wherein the first spot is at the first corner and the second spot is at the second corner of the corresponding rectangular area.

6. The backlight module of claim 1, wherein the display device has a liquid crystal display (LCD) panel.

7. The backlight module of claim 1, wherein corresponding lenses of the plurality of LED light sources form an array of lenses with the grid pattern.

8. The backlight module of claim 7, wherein the array of lenses is made by molding.

9. The backlight module of claim 1, wherein the length L and width W are smaller than 9 millimeters, respectively.

10. The backlight module of claim 1, wherein a distance between the interface and the substrate is smaller than 6 millimeters.

* * * * *